(12) United States Patent
Hornkamp

(10) Patent No.: US 7,119,586 B2
(45) Date of Patent: Oct. 10, 2006

(54) CIRCUIT ARRANGEMENT FOR CONTROL OF A SEMICONDUCTOR CIRCUIT

(75) Inventor: Michael Hornkamp, Waltringen (DE)

(73) Assignee: Eupec Europaische fur Leistungshalbleiter mhH, Munich (DE)

( * ) Notice: Subject to any disclaimer, the term of this patent is extended or adjusted under 35 U.S.C. 154(b) by 56 days.

(21) Appl. No.: 10/953,099

(22) Filed: Sep. 29, 2004

(65) Prior Publication Data
US 2005/0040434 A1    Feb. 24, 2005

Related U.S. Application Data

(63) Continuation of application No. PCT/EP03/02938, filed on Mar. 20, 2003.

(30) Foreign Application Priority Data
Apr. 8, 2002    (DE)    ................. 102 15 363

(51) Int. Cl.
*H03K 3/00*    (2006.01)
(52) U.S. Cl. .............. 327/108; 327/316; 327/318; 327/324
(58) Field of Classification Search ........ 327/108, 327/309, 314, 316, 318, 322, 324, 325, 380
See application file for complete search history.

(56) References Cited

U.S. PATENT DOCUMENTS 4,540,893 A    9/1985 Bloomer ............... 327/432
5,793,232 A *  8/1998 Gallinari et al. ........ 327/110
5,946,178 A    8/1999 Bijlenga ............... 361/91.5

FOREIGN PATENT DOCUMENTS

EP    0 902 537 A2    9/1998
WO    WO 86/05926    10/1986

OTHER PUBLICATIONS

C. Kuratli et al.; "Implementaiton of High Peak-Current IGBT Gate Drive Circuits in VLSI Compatible BiCMOS Technology"; IEEE Journal of Solid-State Circuits, vol. 31, No. 7; pp. 924-932, Jul. 1996.

* cited by examiner

*Primary Examiner*—Kenneth B. Wells
(74) *Attorney, Agent, or Firm*—Baker Botts L.L.P.

(57)    ABSTRACT

A circuit arrangement for control of a regulated path and a semiconductor circuit (1) comprises a control connection, with an input, to which a switching signal (3) for control of the semiconductor circuit (1) is applied, an output, to which the control connector of the semiconductor circuit (1) is coupled, a control circuit (2) arranged between input and output. The switching signal (3) may be retained at the current value by means of a hold signal and an analytical circuit (2), which measures a voltage corresponding to the voltage across the controlled path and generates the holding signal for the control circuit (2) for a given duration when the voltage across the controlled path of the semiconductor circuit (1) has a rise which indicates a switching off of the semiconductor circuit (1).

18 Claims, 2 Drawing Sheets

CIRCUIT ARRANGEMENT FOR CONTROL OF A SEMICONDUCTOR CIRCUIT

CROSS REFERENCE TO RELATED APPLICATION

This application is a continuation of International Application No. PCT/EP03/02938 filed Mar. 20, 2003 which designates the United States, and claims priority to German application no. 102 15 363.9 filed Apr. 8, 2002.

TECHNICAL FIELD OF THE INVENTION

The present invention relates to a circuit arrangement for driving a semiconductor body.

BACKGROUND OF THE INVENTION

As the switching of semiconductor switches such as, for example, IGBT (Insulated Gate Bipolar Transistor) modules becomes faster and faster and currents become higher and higher, it also becomes more difficult to limit turn-off voltages to a permissible range. When the permissible voltage across the controlled path of a semiconductor switch is exceeded, it will be destroyed which should be prevented under all circumstances. A particularly critical case is that of a short circuit since then the rate of current change di/dt is greater. The rate of current change di/dt induces in the stray inductances a voltage which is added to the voltage present in any case. During this process, the permissible voltages can be easily exceeded, particularly across the controlled path of the semiconductor switch.

One approach which is simple in theory consists in reducing the stray inductances. In practice, however, this can be achieved only with difficulty or not at all. One method frequently used in practice consists in using zener diodes in protective circuits, which is known as active clamping. This method consists in the semiconductor switch being slowed down in the turn-off process. Such an arrangement is described, for example, in DE 44 28 675 Al and comprises one or more zener diodes which are connected, for example, between the gate and the collector of an IGBT. If this is used many times, however, this arrangement leads to high power dissipation in the zener diodes and to thermal problems.

SUMMARY OF THE INVENTION

It is, therefore, the object of the invention to specify a circuit arrangement of the type initially mentioned, which does not exhibit these disadvantages.

The object can be achieved by a circuit arrangement for driving a semiconductor switch comprising a controlled path and a control connection, comprising an input to which a switching signal is applied for controlling the semiconductor switch, an output to which the control connection of the semiconductor switch is coupled, a driving circuit, connected between input and output, in which the switching signal can be held at an instantaneous value by a holding signal, and an evaluating circuit which picks up a measurement voltage, corresponding to the voltage across the controlled path, and generates the holding signal for the driving circuit for a particular period of time when the voltage across the controlled path of the semiconductor switch comprises a rise signaling a turning-off of the semiconductor switch.

The object can also be achieved by a circuit arrangement comprising a semiconductor switch comprising a controlled path and a control connection, and a control circuit comprising an input to which a switching signal is applied and an output coupled with the control connection, wherein the control circuit comprises an evaluating circuit receiving a signal corresponding to the voltage across the controlled path, and controlling the switching signal for a particular period of time in such a way that the switching signal is held at an instantaneous value when the voltage across the controlled path of the semiconductor switch comprises a rise signaling a turning-off of the semiconductor switch.

The evaluating circuit can only be activated above a certain minimum voltage across the load path of the semiconductor switch. The evaluating circuit may evaluate the voltage between a connection of the controlled path and the control connection of the semiconductor switch for determining the voltage across the controlled path of the semiconductor switch. An insulated gate bipolar transistor can be provided as the semiconductor switch. The driving circuit may comprise two driver stages connected in cascade via a resistor, the holding signal being fed in at the input of the output driver stage. For feeding in the holding signal, a control transistor can be provided, the controlled path of which is connected between a first supply potential and the input of the output driver stage and the control connection of which is driven in dependence on the measurement voltage, in such a manner that in the case of a signal for turning on the semiconductor switch, generated by the first driver stage, a holding signal is generated which counteracts this signal and thus prevents any further rise. The control connection of the control transistor can be coupled to a connection of the load path of the semiconductor switch via a coupling network. The coupling network may comprise a capacitor-resistor section. The coupling network may comprise a resistor connected between the control connection of the control transistor and the input of the output driver stage. The coupling network may further comprise a capacitor connected between the control connection of the control transistor and the one connection of the load path of the semiconductor switch. The coupling network may comprise a series circuit of two diodes, the series circuit of the diodes being connected between the control connection of the control transistor and a second supply potential and a tap between the two diodes being coupled to one connection of the controlled path of the semiconductor switch. The end of the particular period of time can be determined by a certain voltage across the controlled path of the semiconductor switch being reached. The switching voltage may change slowly at the end of the particular period of time.

The end of the particular period of time can be determined by a particular voltage across the controlled path of the semiconductor switch being reached, particularly a predetermined maximum voltage. After this voltage has been reached, however, the switching voltage is preferably not changed abruptly but changed slowly.

Thus, it is advantageously also possible in the invention to avoid overvoltages during the switching by setting small rates of current change di/dt. At the beginning of the turning-off, the switching signal changes, for example with the falling edge, whereupon the voltage across the controlled path of the semiconductor switch rises. The evaluating circuit registers a voltage rise across the controlled path of the semiconductor switch as soon as the semiconductor switch begins to cut off. At this time, the instantaneous value of the switching signal is "frozen" for a particular period of time so that, although the semiconductor switch continues its voltage rise, the switching signal remains constant. It is only when the voltage across the controlled path of the semiconductor switch has built up completely that the switching voltage is lowered slowly.

In a further development of the invention, the evaluating circuit is only activated above a certain minimum voltage across the load path of the semiconductor switch. The rate of current change di/dt is thus only limited above a certain value of the voltage across the controlled path of the semiconductor switch so that there is no limiting, for example in normal operation, whereas the path to be controlled is influenced in the case of higher voltages in exceptional cases.

In another development of the invention, it is provided that the evaluating circuit evaluates the voltage between a connection of the controlled path and the control connection of the semiconductor switch for determining the voltage across the controlled path of the semiconductor switch. In this manner, the voltage across the controlled path can be determined with as particularly little expenditure. It is thus possible, for example in the case of IGBT (Insulated Gate Bipolar Transistor), to evaluate the gate-collector voltage as a measure of the voltage occurring between emitter and collector.

In addition, the circuit arrangement according to the invention is suitable, in particular, for driving IGBTs, and other semiconductor switches such as, for example, MOS field effect transistors, SiC field effect transistors, bipolar transistors etc. can also be driven. IGBTs, in particular exhibit a so-called Miller Plateau in the falling edge of the gate-emitter voltage during turn-off, that is to say an area in which the gate-emitter voltage no longer drops for a short period of time. In this area, the semiconductor switch also begins to cut off. When the invention is applied in an IGBT or a semiconductor switch with similar characteristics, the Miller area of the semiconductor switch is advantageously detected according to the invention and held for the particular period of time.

It can furthermore be provided that the driving circuit exhibits two driver stages connected in cascade via a resistor, the holding signal being fed in at the input of the output driver stage.

For feeding in the holding signal, a control transistor can be provided, the controlled path of which is connected between a first supply potential and the input of the output driver stage, and the control connection of which is driven in dependence on the measurement voltage, in such a manner that in the case of a signal for turning on the semiconductor switch, generated by the first driver stage, the holding signal is generated which counteracts this signal and thus flattens its rise.

The control connection of the control transistor is preferably coupled to a connection of the load path of the semiconductor switch via a coupling network. The coupling network, in turn, preferably exhibits a capacitor-resistor section (RC section).

The resistor of the capacitor-resistor section can be formed by a resistor which is connected between the control connection of the control transistor and the input of the output driver stage. The capacitor can be connected between the control connection of the control transistor and the one connection of the load path of the semiconductor switch. In the case of an IGBT, for example, this connection of the load path can be given by its collector.

Finally, the coupling network can exhibit a series circuit of two diodes, the series circuit of the diodes being connected between the control connection of the control transistor and a second supply potential and the tap being coupled to one connection of the controlled path of the semiconductor switch.

The decay time constant for the holding signal, and thus for the switching signal, is preferably adjustable so that the maximum rate of current increase is freely adjustable and can be adapted to different types of semiconductor switch, if necessary.

BRIEF DESCRIPTION OF THE DRAWING

In the text which follows, the invention will be explained in greater detail with reference to the exemplary embodiments shown in the figure drawings, in which.

DESCRIPTION OF THE INVENTION

Figure 1:
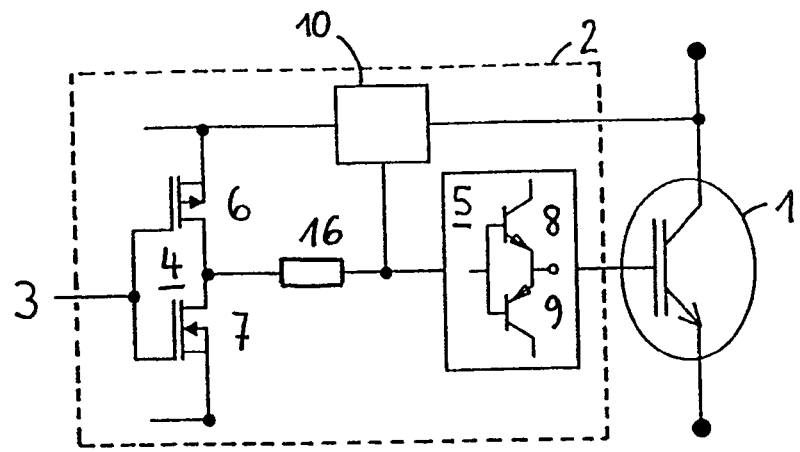
FIG. 1 shows a first, general exemplary embodiment of a circuit arrangement according to the invention.

In the exemplary embodiment shown in FIG. 1, an insulated gate bipolar transistor, called IGBT 1 in the text which follows, is driven by a driving circuit 2 in dependence on a switching signal 3. The driving circuit 2 consists of two driver stages 4 and 5, the driver stage 5 following the driver stage 4 via a current limiting element, namely a resistor 16. A driver stage 4 consists of a push-pull amplifier stage with MOS field effect transistors 6 and 7 whereas the driver stage 5 exhibits a push-pull emitter follower with two bipolar transistors 8 and 9. The output of the driver stage 5 is connected to the gate of IGBT 1.

The driving circuit 2 also exhibits an evaluating device 10 which is connected between the drain connection of IGBT 1 and the junction of driver stage 4 and driver stage 5.

The evaluating circuit determines the voltage across the emitter-collector path of IGBT 1, in this manner detects the beginning of the cut-off state and then freezes the instantaneous value of the switching signal 3. Since the IGBT remains longer at the voltage level of the Miller Plateau, a small rate of current change di/dt of the collector current is achieved when turning-off particularly high voltages.

Figure 2:
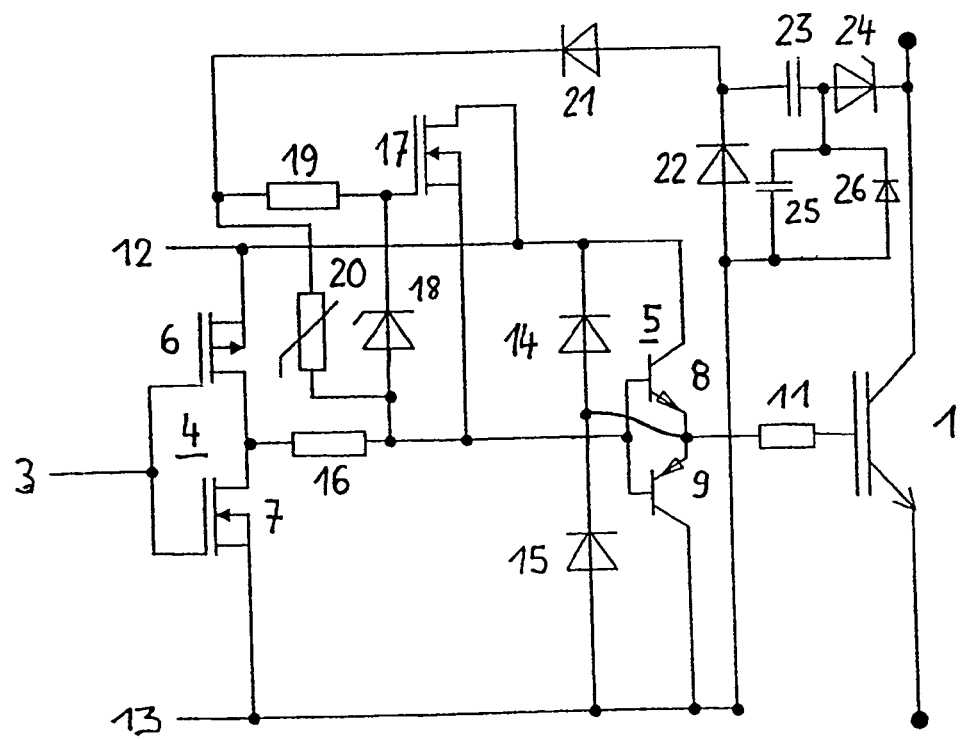
FIG. 2 shows a second, detailed exemplary embodiment of a circuit arrangement according to the invention.

A detailed embodiment of a circuit arrangement according to the invention, which goes further, is shown in FIG. 2. Starting with the exemplary embodiment of FIG. 1, an IGBT 1 is again provided which is driven by the driver stage 5, already explained with transistors 8 and 9 via a resistor 11. The transistor 8 is a bipolar transistor of the NPN type, the emitter and base of which are connected to the emitter and base, respectively, of the transistor 9 which, in turn, is given by a bipolar transistor of the PNP type. The collector of the transistor 8 is connected to a positive supply potential 12 whereas the collector of the transistor 9 is connected to a negative supply potential 13. The emitters of transistors 8 and 9, which are coupled together, are conducted via in each case one diode 14 and 15, respectively, in the reverse direction to the positive supply potential 12 and the negative supply potential 13, respectively.

At the bases of the transistors 8 and 9, which are coupled together, are connected to the output of the driver stage 4 via the resistor 16. As in the exemplary embodiment of FIG. 1, the driver stage 4 comprises two MOS field effect transistors 6 and 7, one (6) of which is of the p-channel type and the other one (7) of which is of the n-channel type. Source and drain of the transistor 6 are connected to source and drain, respectively, of the transistor 7. The interconnected sources form the output of the driver stage 4 whereas the interconnected gates form the input to which the switching signal 3 is applied.

In the exemplary embodiment of FIG. 2, the evaluating circuit 10 from FIG. 1 is formed by, among other things, an MOS field effect transistor 17 of the n-channel type, the source connection of which is connected to the coupled bases of the transistors 8 and 9 and the drain of which is connected to the positive supply potential. Between the gate of the transistor 17 and the coupled bases of the transistors 8 and 9, a zener diode 18 is also connected. The gate of the transistor 17 is conducted via a resistor 19 to a junction from which, on the one hand, a resistor 20 leads to the coupled bases of the transistors 8 and 9 and which, on the other hand, is connected to the cathode of a diode 21, the anode of which is connected to a further junction. The further junction is connected, on the one hand, to the cathode of a diode 22 and, on the other hand, a connection of a capacitor 23. The other connection of the capacitor 23 is connected to the collector of the IGBT 11 via a zener diode 24. Like the anode connection of diode 22, the tap between capacitor 23 and zener diode 24 is connected in a reverse direction to the negative supply potential 13 via a capacitor 25 and a diode 26 connected in parallel therewith.

In the exemplary embodiment of FIG. 2, the time constant, and thus the rate of current change di/dt, is predetermined by means of the RC section with capacitor 23 and resistor 20. After the voltage rise to the full voltage at the collector, the "holding" of the switching signal continues until the capacitor 23 (capacitance $C_{23}$) is completely recharged. The current $I=C_{23} \cdot dv/dt$ at the resistor 20 slows the current drop in the IGBT 1 after the voltage rise via the transistor 17 and the driver stage 5.

The operation of the exemplary embodiment of FIG. 2 is based on the following considerations. If the driver stage 4 receives a signal with a level of zero, the transistor 7 is turned on, and is turned off via the driver stage 5 of the IGBT 1. When the threshold voltage is reached, the IGBT 1 is cut off and the voltage between emitter and collector of the IGBT 1 rises. At this time, the corresponding potential of the capacitor 23 changes. A current flows via the resistor 20 to the negative supply potential 13. The voltage dropped across the resistor 20 switches on the transistor 17 which immediately results in a current flow via the resistor 16 to the negative supply potential 13.

Due to this current, in turn, a positive voltage is dropped across the resistor 16 which holds the IGBT 1 at its Miller Plateau directly via the driver stage 5. Since the capacitor 23 is discharged via the resistor 20, a time constant is obtained in consequence. Within this time constant which determines the discharge time, the voltage at the gate of the IGBT 1 is thus maintained and the turning-off of the IGBT 1 is slowed down.

If the zener diode 24 is connected in series with the capacitor 23, the evaluating circuit, in conjunction with the driver stages 4 and 5, only acts when the zener voltage is exceeded. To compensate for the high barrier layer capacitance of the zener diode 24 and thus to eliminate the influence of the circuit below the zener voltage, a compensating capacitance, namely the capacitor 25, is connected from the anode of the zener diode 24 to the negative supply potential 13 or to ground, respectively. So that the capacitor 23 is also recharged when the IGBT 1 is turned on, the diode 22 is provided, the diode 21 being provided for protecting the transistor 17 and the zener diode 18 again a polarity reversal. The diode 26, finally, is used for discharging the capacitor 25. In the exemplary embodiment, the diodes 14 and 15 are intended to protect the two driver stages 4 and 5 against polarity reversal and/or overvoltage.

If, finally, the resistor 20 is constructed as a potentiometer, the intensity of the intervention can be adjusted. In addition, type-related differences in the semiconductor switches with respect to their switching characteristic can be compensated in other semiconductor switches by means of an adjustable maximum rate of current turn-off.

Figure 3:
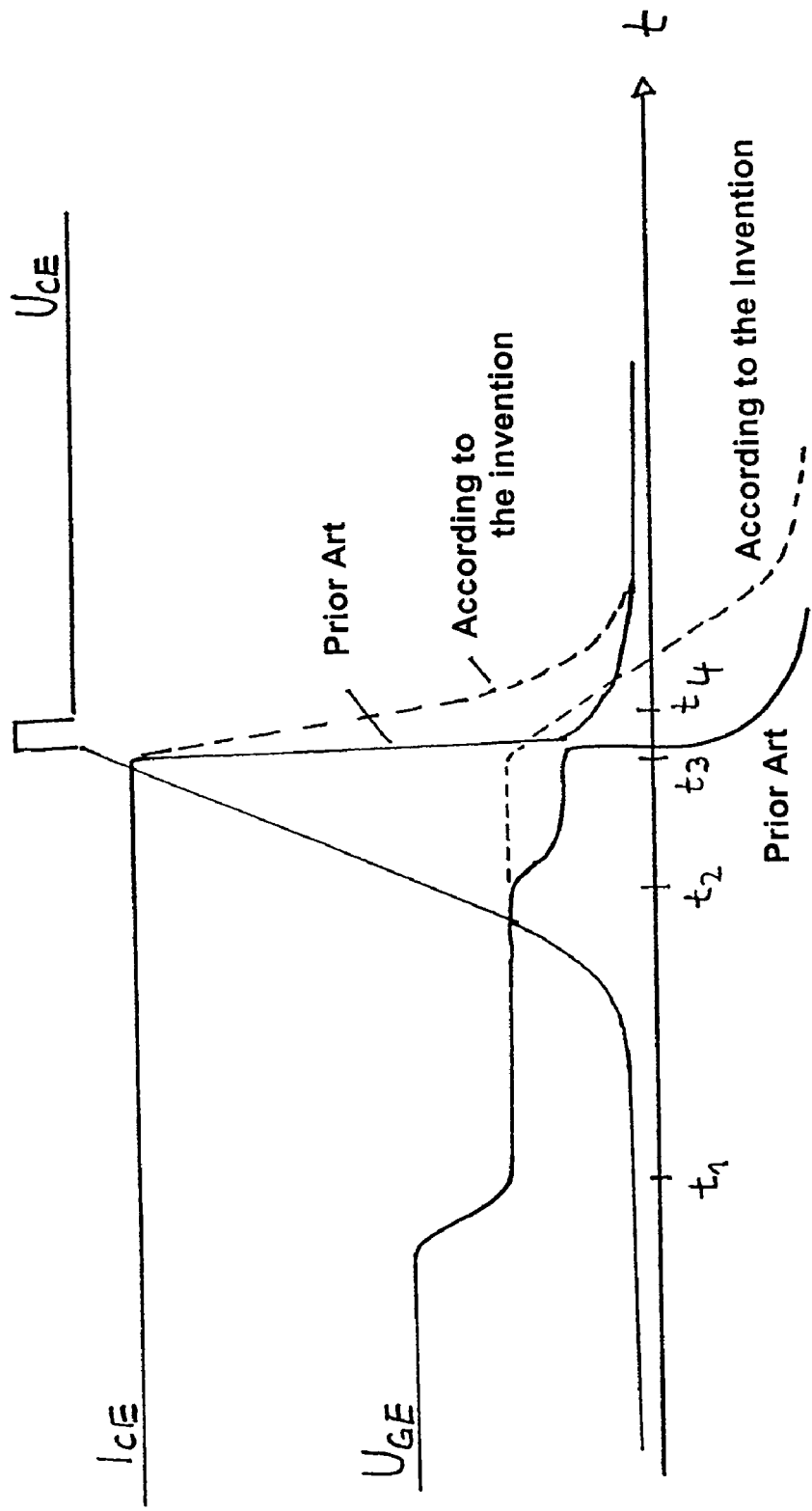
FIG. 3 shows the course of the Miller Plateau of an IGBT when driven with and without the circuit arrangement according to the invention.

FIG. 3 shows the courses of the collector-emitter voltage $U_{CE}$, the collector-emitter current $I_{CE}$ and the gate-emitter voltage $U_{CE}$ of the IGBT 1 versus time t when driven with and without the circuit arrangement according to the invention. In the case of a previously used drive arrangement, the gate-emitter voltage $U_{GE}$ steeply drops, for example starting from 15 V, until its reaches the Miller Plateau at about 7 V ($t_1$). The voltage remains here for some time until shortly before the beginning of the drop in the collector-emitter current $I_{CE}$ ($t_2$) and then continues to drop steeply to −15 V in two stages. The first stage is flatter and lasts to the actual drop in collector-emitter current $I_{CE}$ ($t_3$). The following stage is steeper and lasts until the gate-emitter voltage $U_{CE}$ of the IGBT 1 has completely dropped. This is associated with a rise in the collector-emitter voltage $U_{CE}$ which begins at time $t_1$ and opens into the peak value of the collector-emitter voltage $U_{CE}$ at time $t_2$. The collector-emitter voltage $U_{CE}$ remains there for a short time ($t_4$) and then drops to a somewhat lower value at which it remains. The collector-emitter current $I_{CE}$ remains constant up to time $t_3$ after which it drops steeply.

In the case of the driving arrangement according to the invention, in contrast, the gate-emitter voltage $U_{GE}$ remains at the Miller Plateau up to time $t_3$, that is to say it remains clearly longer at the Miller Plateau and then drops in a comparatively shallow manner. Here, too, the collector-emitter current $I_{CE}$ remains constant up to time $t_3$ but then drops in a clearly more shallow manner.

I claim:

1. A circuit arrangement for driving a semiconductor switch comprising a controlled path and a control connection, comprising
    an input to which a switching signal is applied for controlling the semiconductor switch,
    an output to which the control connection of the semiconductor switch is coupled,
    a driving circuit, connected between input and output, in which the switching signal can be held at an instantaneous value by a holding signal, and
    an evaluating circuit which picks up a measurement voltage, corresponding to the voltage across the controlled path, and generates the holding signal for the driving circuit for a particular period of time when the voltage across the controlled path of the semiconductor switch comprises a voltage rise, said voltage rise signaling a turning-off of the semiconductor switch, wherein the driving circuit comprises first and second driver stages connected in cascade via a resistor, the holding signal being fed in at the input of the second driver stage.

2. The circuit arrangement as claimed in claim 1, in which the evaluating circuit is only activated above a certain minimum voltage across the load path of the semiconductor switch.

3. The circuit arrangement as claimed in claim 1, in which the evaluating circuit evaluates the voltage between a connection of the controlled path and the control connection of the semiconductor switch for determining the voltage across the controlled path of the semiconductor switch.

4. The circuit arrangement as claimed in claim 1, in which an insulated gate bipolar transistor is provided as the semiconductor switch.

5. The circuit arrangement as claimed in claim 1, in which, for feeding in the holding signal, a control transistor is provided, the controlled path of which is connected between a first supply potential and the input of the second driver stage and the control connection of which is driven in dependence on the measurement voltage, in such a manner that in the case of an output signal of the first driver stare for turning on the semiconductor switch, the holding signal is generated which counteracts the output signal of the first driver stage.

6. The circuit arrangement as claimed in claim 5, in which the control connection of the control transistor is coupled to a connection of the controlled path of the semiconductor switch via a coupling network.

7. The circuit arrangement as claimed in claim 6, in which the coupling network comprises a capacitor-resistor section.

8. The circuit arrangement as claimed in claim 7, in which the coupling network comprises a resistor connected between the control connection of the control transistor and the input of the second driver stage.

9. The circuit arrangement as claimed in claim 7, in which the coupling network comprises a capacitor connected between the control connection of the control transistor and the connection of the controlled path of the semiconductor switch.

10. The circuit arrangement as claimed in claim 7, in which the coupling network comprises a series circuit of two diodes, the series circuit of the diodes being connected between the control connection of the control transistor and a second supply potential and a tap between the two diodes being coupled to the connection of the controlled path of the semiconductor switch.

11. The circuit arrangement as claimed in claim 1, in which the end of the particular period of time is determined by a certain voltage across the controlled path of the semiconductor switch being reached.

12. The circuit arrangement as claimed in claim 1, in which the switching voltage changes slowly at the end of the particular period of time.

13. A circuit arrangement comprising:
   a semiconductor switch comprising a controlled path and a control connection,
   a control circuit comprising an input to which a switching signal is applied and an output coupled with the control connection, wherein the control circuit comprises an evaluating circuit receiving a signal corresponding to the voltage across the controlled path, and controlling the switching signal for a particular period of time in such a way that the switching signal is held at an instantaneous value when the voltage across the controlled path of the semiconductor switch comprises a voltage rise signaling a turning-off of the semiconductor switch, wherein the control circuit comprises first and second driver stages connected in cascade via a resistor, the holding signal being fed in at the input of the second driver stage and a control transistor having a controlled path connected between a first supply potential and the input of the second driver stage and a control connection which is driven in dependence on the measurement voltage in such a manner that in the case of a signal generated by the first driver stare for turning on the semiconductor switch, the holding signal is generated which counteracts this signal and thus prevents any further rise.

14. The circuit arrangement as claimed in claim 13, in which the evaluating circuit is only activated above a certain minimum voltage across the load path of the semiconductor switch.

15. The circuit arrangement as claimed in claim 13, in which the control connection of the control transistor is coupled to a connection of the controlled path of the semiconductor switch via a coupling network and the coupling network comprises a capacitor-resistor section with a resistor connected between the control connection of the control transistor and the input of the second driver stage.

16. The circuit arrangement as claimed in claim 15, in which the coupling network comprises a capacitor connected between the control connection of the control transistor and the connection of the controlled path of the semiconductor switch and the coupling network comprises a series circuit of two diodes, the series circuit of the diodes being connected between the control connection of the control transistor and a second supply potential and a tap between the two diodes being coupled to the connection of the controlled path of the semiconductor switch.

17. The circuit arrangement as claimed in claim 13, in which the end of the particular period of time is determined by a certain voltage across the controlled path of the semiconductor switch being reached.

18. The circuit arrangement as claimed in claim 13, in which the switching voltage changes slowly at the end of the particular period of time.

* * * * *